United States Patent [19]
Kruse et al.

[11] Patent Number: 5,783,777
[45] Date of Patent: Jul. 21, 1998

[54] DUMMY FRONT PANEL FACE PLATE FOR CLOSING ELECTRONIC CIRCUIT CARD INSERTION OPENING IN FRONT PANEL OF DIGITAL TERMINAL CHANNEL BANK

[75] Inventors: Grant Joseph Kruse; James Brian Coker; Jacob Daniel McCleary, all of Huntsville, Ala.

[73] Assignee: Adtran, Inc., Huntsville, Ala.

[21] Appl. No.: 717,499

[22] Filed: Sep. 20, 1996

[51] Int. Cl.⁶ .................. H02G 3/14; H05K 5/03
[52] U.S. Cl. .................. 174/66; 361/801; 361/802; 439/135
[58] Field of Search .................. 174/66, 67, 50; 220/241, 242, 3.8; 361/796, 800, 801, 802, 724, 725, 754, 786, 798, 818; 439/135, 148, 325, 327, 328, 476.1, 483

[56] References Cited

U.S. PATENT DOCUMENTS

| | | | |
|---|---|---|---|
| 4,301,494 | 11/1981 | Jordan | 361/725 X |
| 4,731,702 | 3/1988 | Hiatt et al. | 361/391 |
| 5,084,802 | 1/1992 | Nguyenngoc | 361/818 |
| 5,283,713 | 2/1994 | Nagafuji et al. | 361/796 |
| 5,319,524 | 6/1994 | Welch et al. | 439/327 X |
| 5,432,682 | 7/1995 | Giehl et al. | 361/801 X |
| 5,559,678 | 9/1996 | Fukuda et al. | 361/818 |

*Primary Examiner*—Dean A. Reichard
*Attorney, Agent, or Firm*—Charles E. Wands

[57] ABSTRACT

A blank, or dummy, face plate element engages top and bottom edges of a cabinet frame, directly behind a front panel card insertion opening that provides access to multiple card slots of an electronic equipment rack. The dummy face plate includes a rearwardly projecting, upper lip, that is located adjacent to a top edge of the face plate, and has a notch immediately adjacent to the rear surface of the face plate. The notch fits within and is captured by an upper edge of the cabinet frame. A rearwardly projecting, generally U-shaped, flexible lower lip is provided adjacent to a lower edge of the face plate and includes a pair of finger grips. The flexible lower lip has a ridge that becomes aligned with the lower edge of the faceplate when the lower lip is flexed upwardly toward the first lip, and a notch adjacent to the ridge that is captured by the cabinet frame. Card-simulating wall portions extend from the face plate alongside the upper and lower lips and are sized and shaped to fit within and slidably engage upper and lower card insertion tracks of an empty card slot, as the dummy face plate is installed.

22 Claims, 2 Drawing Sheets

5,783,777

1

DUMMY FRONT PANEL FACE PLATE FOR CLOSING ELECTRONIC CIRCUIT CARD INSERTION OPENING IN FRONT PANEL OF DIGITAL TERMINAL CHANNEL BANK

FIELD OF THE INVENTION

The present invention relates in general to housing structures for electronic circuits, such as those used for the installation of telecommunication equipment, and is particularly directed to a new and improved blank, or 'dummy', front panel face plate configuration for closing a portion of an opening in the front panel of a cabinet or rack, behind which no electronic circuit card has been installed. The cabinet is of the type that houses a plurality of circuit cards, which are customarily inserted into parallel card slots for electrical and physical engagement with a backplane connector, and which are terminated by way of respective side-by-side front panel face plates that form the front panel of the equipment rack.

BACKGROUND OF THE INVENTION

For space efficiency and ease of access to circuit components, housing configurations for electronic circuits and components customarily employ a plurality of parallel circuit card slots having parallel card guide and support tracks that are sized to receive respective electronic circuit cards which plug into electrical backplane connectors installed at a rear portion of a cabinet or rack. For this purpose, as diagrammatically illustrated in FIGS. 1-3, a standard printed wiring circuit card (motherboard) 10 typically has a generally longitudinal rectangular shape, a first (or rear) end 12 of which has a plurality of (usually gold) lead connector traces 14 that are sized and arranged to engage associated conductors along the interior sides of a backplane connector 20, when the rear end of the card is physically inserted into and is captured by the connector.

A second (front) end 16 of the card is affixed to a face plate 30 that is sized to fit within and thereby close a portion of a card slot opening 40 at the front of the equipment rack. The width 32 of the face plate 30 is defined in accordance with the spacing between adjacent card slots 35 corresponding to the spacing between adjacent pairs or sets of upper and lower card slot tracks 42 and 44, respectively, that extend from the card slot opening 40 at the front of the cabinet to the rear of the cabinet adjacent to a backplane connector 20. The upper and lower card slot guide tracks 42 and 44 are sized to receive upper and lower edges 17 and 18, respectively of card 10, so that as the card 10 is inserted into the cabinet through the opening slot 40, it slides within the guide tracks 42 and 44 of a respective card slot until the rear end 12 of the card containing the conductive traces 14 is physically plugged into and captured by the backplane connector 20. To assist in removing the card, a rotatable hinge or latch (not shown) may pass through a slot in the face plate and engage the card adjacent to a lip of the opening 40. Manually 'popping' the latch will impart sufficient extraction force to urge the card out of the backplane connector 20 toward the front of the cabinet, thereby facilitating gripping of the face plate and removal of the card from its slot 35.

In some installations, not all of the card slots will contain circuit cards, so that the front panel opening 40 will have one or more empty spaces that would otherwise be closed by respective face plates of such cards. A non-limiting example of such an installation is a digital terminal channel bank containing a plurality of channel card slots respectively

2 associated with different time slots of a time division multiplex communication system. As diagrammatically illustrated in FIG. 4, when the channel bank is used for integrated services digital network (ISDN) applications, since the signal processing functionality of a respective ISDN card occupies more than a single time slot (e.g., three time slots associated with two bearer (B) and one signalling (D) channel), one or more empty card slots 35E adjacent to an installed ISDN card 10 in a slot 35 will not be populated.

In such a case, in order to close the front panel's card slot opening 40, blank or 'dummy' cards 10D that contain no conductor traces may be inserted into the unused or empty card slots 35E, as illustrated in the front panel view of FIG. 5. In order to prevent a dummy card 10D from interfering with the signals being interfaced at the backplane, and to minimize cost, a dummy card does not contain a set of non-functional gold conductor traces 14, and the rear end 12D of a dummy card 10D is dimensioned to be shorter than a full sized card, so that the dummy card terminates short of and therefore does not engage the backplane connector 20, as shown in FIG. 6.

Because the backplane connector 20, that would otherwise physically retain the rear end of a conventional circuit card, cannot be engaged by the shorter dummy card, the dummy card has no physical means to securely retain it in the cabinet, and therefore the dummy card effectively 'floats' in its card slot. Namely, a dummy card cannot be maintained in a secure, front panel closure position—a condition mandated by telephone service providers, in order to maintain the structural integrity of the cabinet's front panel, and prevent disruption of the normal path of cooling air flow through the interior of the cabinet.

SUMMARY OF THE INVENTION

In accordance with the present invention, the desire to securely close a card slot opening in an equipment rack's front panel, without the problems of a conventional dummy card configuration, described above, is effectively achieved by a new and improved dummy front panel face plate that is configured to fit between and releasibly, but securely engage top and bottom lip edges of the card insertion opening adjacent to the card slot of interest. For this purpose, the dummy face plate of the present invention includes a rearwardly projecting, upper lip, that is located adjacent to a top edge of the face plate, the upper lip having a notch, or groove, located immediately adjacent to the rear surface of the face plate, that is sized to fit within and be captured by an upper edge of the cabinet frame immediately adjacent to the card insertion opening.

The dummy face plate further includes a first lower finger grip element extending from its front surface adjacent to its bottom edge. The dummy face plate also includes a rearwardly projecting, generally U-shaped, flexible lower lip. This lower U-shaped lip has a first lip wall portion that is solid with and projects away from the rear surface of the face plate. The flexible lower lip further includes a second lip wall portion, that extends from a U-bend and slightly inclined downwardly therefrom at an acute angle back toward the face plate. This downwardly inclined second lip wall portion extends beyond the bottom edge of the face plate and includes a second finger grip element that is generally alongside the first finger grip element. The downwardly inclined second lip wall portion also has a notch located immediately adjacent to a ridge portion that is sized to become aligned with the lower edge of the faceplate when the second lip wall portion is flexed upwardly toward the first lip wall portion. The notch in this flexible second lip wall portion is sized to fit within and be captured by a lower edge of the cabinet frame immediately adjacent to the card insertion opening.

Respective card-simulating wall portions extend from the face plate alongside the upper and lower lips and are sized and shaped to fit within and slidably engage upper and lower card insertion tracks of an empty card slot, as the dummy face plate is inserted through the front panel's card slot opening. During installation of the dummy front panel face plate, an installer squeezes the finger grips of the lower, flexible lip of the dummy face plate, allowing the flexible second lip wall portion to travel slightly above or on the lower edge of the cabinet frame immediately adjacent to the card insertion opening. The notch in the upper lip is allowed to be captured by the upper frame edge. Because of the downward bias of the second lip wall portion of the generally U-shaped, flexible lower lip, its notch is urged against the lower edge of the cabinet frame when the two become mutually aligned. Releasing the finger grips allows the face plate to be securely captured in the card insertion opening.

DETAILED DESCRIPTION

As pointed out briefly above, the invention remedies the problems of a conventional dummy card by a new and improved blank or dummy front panel face plate element that is insertable into the guide tracks of a respective card slot, and is configured to releasibly, but securely, engage top and bottom edges of the equipment frame adjacent to the card insertion opening, so as to close the opening in cooperation with one or more other such dummy front panel face plate elements or the front panel face plates of actual circuit cards installed in adjacent card slots.

Figure 1:
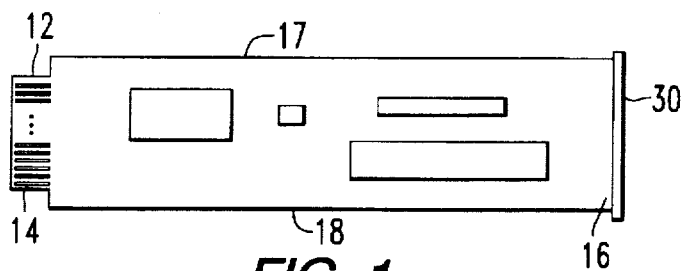
FIG. 1 is a diagrammatic side view of a printed wiring circuit card that is installable into an electrical backplane connector of a telecommunications channel bank equipment rack.
Figure 3:
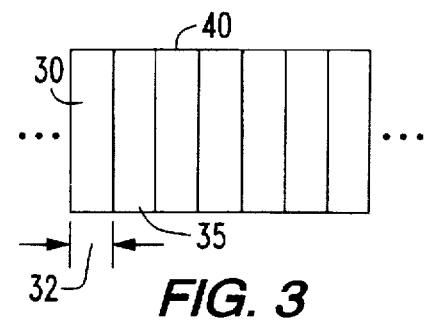
FIG. 3 is a diagrammatic front view of a card slot opening for receiving a plurality of parallel arranged circuit cards.
Figure 2:
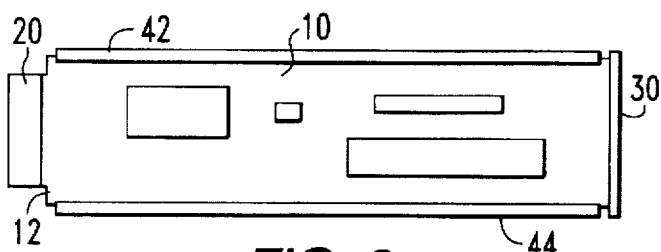
FIG. 2 shows the printed wiring circuit card of FIG. 1 inserted into guide tracks of a card slot and captured by an electrical backplane connector.
Figure 4:
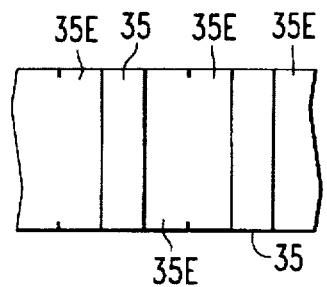
FIG. 4 is a diagrammatic front view of a card slot opening of a digital terminal channel bank exposing less than fully populated card slots.
Figure 6:
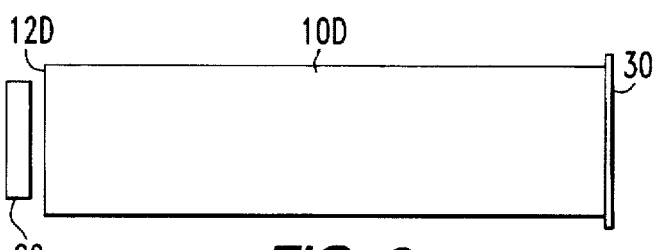
FIG. 6 is a diagrammatic side view of a conventional dummy card that is dimensioned to terminate short of a backplane connector and not engage a card slot backplane connector.
Figure 5:
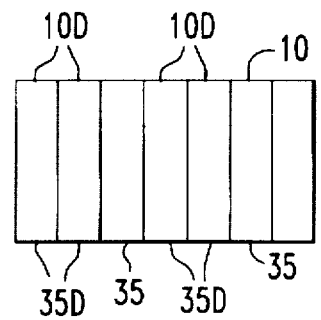
FIG. 5 is a diagrammatic front view of front view of the card slot opening of FIG. 4, showing dummy cards installed to close the card slot opening.
Figure 7:
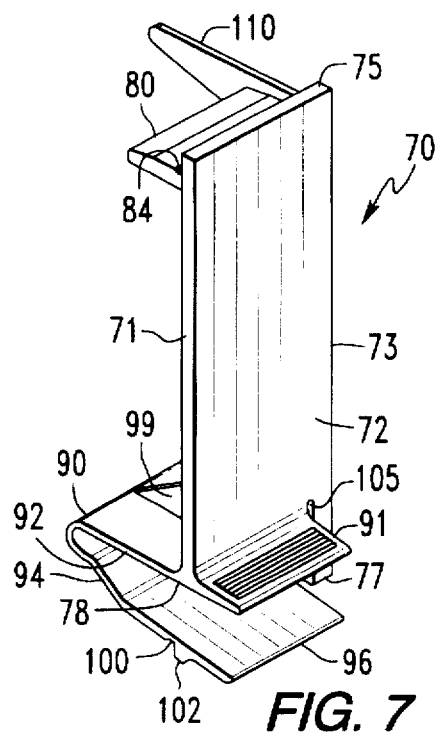
FIGS. 7 and 8 are left and right perspective views of a dummy front panel face plate in accordance with the present invention.
Figure 8:
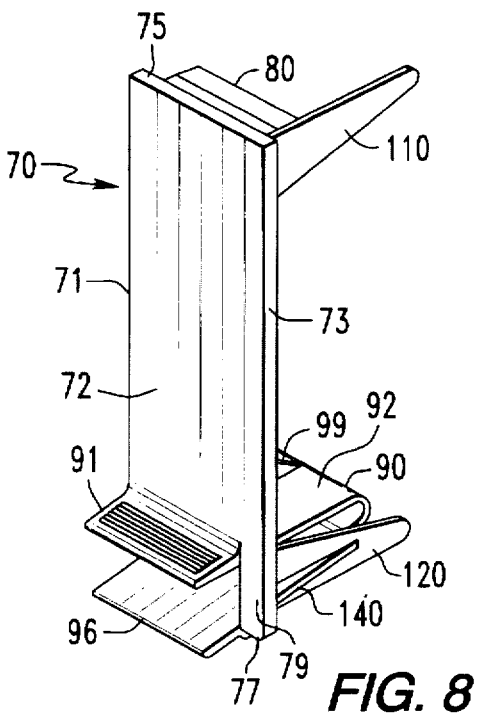
Figure 10:
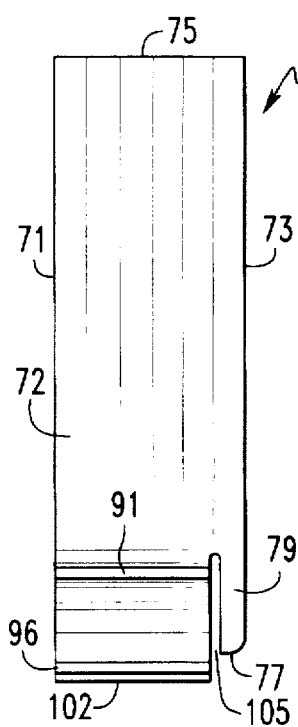
FIG. 10 is a front view of the dummy front panel face plate shown in perspective in FIGS. 7 and 8.
Figure 11:
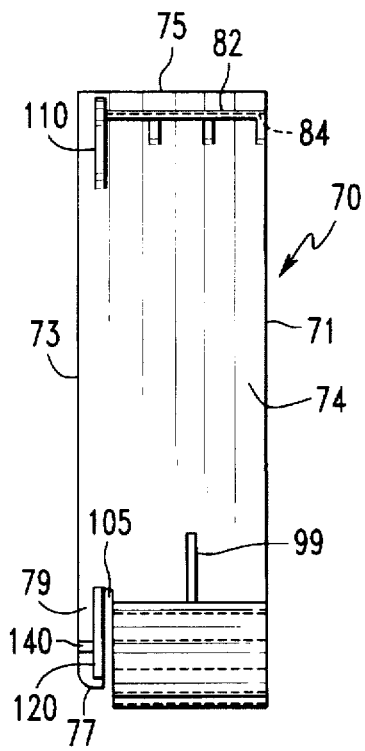
FIG. 11 is a rear view of the dummy front panel face plate shown in perspective in FIGS. 7 and 8.
Figure 9:
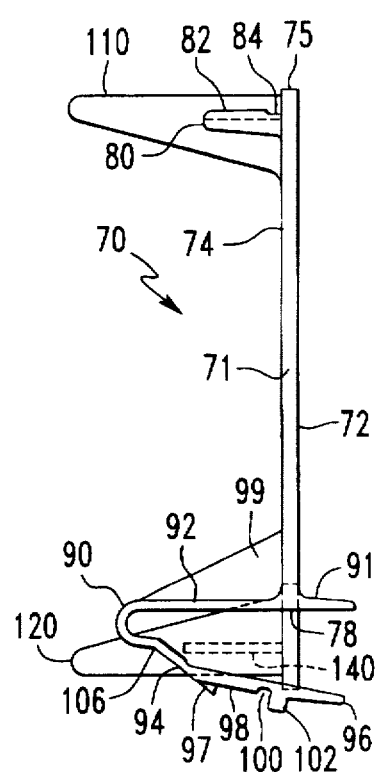
FIG. 9 is a side view of the dummy front panel face plate shown in perspective in FIGS. 7 and 8.

As diagrammatically illustrated in the perspective views of FIGS. 7 and 8, the side view of FIG. 9, the front view of FIG. 10 and the rear view of FIG. 11, the dummy front panel face plate element of the present invention, which is preferably comprised of a rugged, sturdy plastic material, such as an injection-molded, commercially available polycarbonate-based plastic, as a non-limiting example, comprises a generally flat or planar face plate 70 that is sized to conform with the size of a conventional circuit card's front panel face plate, described above, so that it readily fits between upper and lower confines of a standard card insertion opening of an electronic equipment rack. For this purpose, face plate 70 has first and second side edges 71 and 73, respectively, an upper or top edge 75 and a lower or bottom edge 77. Face plate 70 has a front surface 72 that faces outwardly and forms part of the outer panel surface of the equipment, and a rear surface 74 that faces rearwardly towards the backplane, when the dummy front panel face plate element is installed in a card slot.

For securely engaging the top edge of the equipment frame adjacent to the equipment rack's card insertion opening, the dummy face plate element has an upper lip 80, located just beneath the top edge 75, upper lip 80 projecting from the face plate's rear surface 74. An upper surface 82 of lip 80 has a notch or groove 84 located immediately adjacent to the rear surface 74 of the face plate 70, that is sized to fit within and be captured by an upper edge or rim of the equipment cabinet frame immediately adjacent to the card insertion opening.

To securely engage the lower edge of an equipment frame adjacent to a card insertion opening, the dummy face plate further includes a rearwardly projecting, generally U-shaped, flexible lower lip 90. Flexible lower lip 90 is separated from an adjacent lower portion 79 of faceplate 70 by means of a slot 105. As will be described, lower portion 79 of faceplate 70 supports a rearward facing card-simulating wall portion 120, which stably aligns and guides the dummy front panel face plate element into a lower guide track of an empty card slot. Slot 105 allows the lower lip 90 to flex relative to lower portion 79 of the faceplate, particularly when the wall portion 120 is inserted into a card slot guide track.

The generally U-shaped, flexible lower lip 90 has a first lip wall portion 92 that is solid with and projects away from a bottom edge 78 of the face plate. To provide structural rigidity to the first lip wall portion 92, a gusset 99 is installed between the top surface of the first lip wall portion 92 of the lower lip 90 and the rear surface 74 of the face plate 70. The first lip wall portion 92 of lower lip 90 also extends forwardly of the front surface 72 of face plate 70 forming a first finger grip element 91.

Flexible lower lip 90 further includes a second lip wall portion 94, that extends at an acute angle, in a slightly downwardly inclined manner toward the face plate 70. The downwardly inclined second lip wall portion 94 extends beyond the bottom edge 78 of the face plate 70 as a second finger grip element 96, that is generally alongside but spaced beneath the first finger grip element 91. The top surface of the first finger grip element 91 and the bottom surface of the second finger grip element 96 are preferably textured (e.g., roughened or grooved) to facilitate securely gripping the dummy front panel face plate. The downwardly inclined second lip wall portion 94 also has a bend 106 that allows the lower lip 90 to clear the front edge of a lower frame edge of a card slot.

The second lip wall portion 94 further includes a notch or groove 100 located immediately adjacent to a ridge portion 102 that is sized to become aligned with the lower edge 77 of the face plate 70 when the second lip wall portion 94 is flexed upwardly toward the first lip wall portion 92. The notch 100 in flexible second lip wall portion 94 is sized to fit within and be captured by a lower edge of the cabinet frame immediately adjacent to the card insertion opening, when so flexed upwardly into alignment with the lower edge 77 of the face plate. A flange 97 extends from the lower surface 98 of the second lip wall portion 94, and serves the function of a conventional latch, fitting within a slot in the cabinet frame, so as to prevent the dummy front panel face plate element from being removed from a card slot, unless the second lip wall portion 94 is flexed sufficiently upwardly by means of the second finger grip element 96 to pass by the lower edge of the card slot.

In order to stably align and guide the dummy front panel face plate element into the upper and lower guide tracks of an empty card slot, a simulated circuit card structure is provided. This simulated circuit card structure comprises respective upper and lower card-simulating wall portions 110 and 120, which as can be seen from FIGS. 7, 8 and 9, have a size that is only a small portion of that of a standard printed circuit card, and a depth that extends into only a first, relatively small portion of the depth of the upper and lower guide tracks. Wall portions 110 and 120 have a thickness generally corresponding to that of a standard printed circuit card, extend from the rear surface 74 of the face plate 70 alongside the upper and lower lips 80 and 90. To provide structural rigidity to the upper wall portion 110, the width of the upper lip 80 is such as to intersect and be solid with upper wall portion 110. Also, a reinforcing gusset 140 is installed between lower wall portion 120 and the rear surface 74 of the face plate 70.

To securely close an empty card slot by means of the dummy front panel face plate element of the present invention, an installer squeezes the first and second finger grip elements 91 and 96, respectively. This allows the flexible second lip wall portion 94 of the generally U-shaped, flexible lower lip 90 to travel slightly above or on the lower edge of the cabinet frame, immediately adjacent to its card insertion opening. As the upper and lower card-simulating wall portions 110 and 120 travel along the upper and lower guide tracks of the card slot, notch 84 in the upper lip 80 becomes aligned with and captured by the frame adjacent to the upper edge of the card slot opening. Because of the downward bias of the second lip wall portion 94 of the generally U-shaped, flexible lower lip 90, notch 100 in flexible lower lip portion 94 will be urged toward the lower edge of the cabinet frame. When the notch 100 becomes aligned with the frame, the installer releases the second finger grip 96, whereupon the front panel face plate element is securely captured in the card insertion opening.

As will be appreciated from the foregoing description, the failure of a conventional dummy card to securely close a card slot opening in an equipment rack's front panel is effectively obviated in accordance with the dummy front panel face plate of the present invention, which is configured to releasibly and securely engage top and bottom lip edges of a card slot adjacent to the card slot of interest by means of a pair of finger grip elements. As described above, squeezing these finger grip elements readily allows the flexible second lip wall portion of the generally U-shaped, flexible lower lip to travel slightly over the lower edge of the cabinet frame, immediately adjacent to its card insertion opening, so that notches in the upper and lower lips may become aligned with and captured by the frame adjacent to the upper and lower edges of the card slot opening.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A dummy panel face plate element for closing a card insertion opening of an electronic equipment cabinet, said card insertion opening being sized to expose a plurality of electronic circuit card slots that contain card insertion tracks into which electronic circuit cards are slidably insertable to engage a backplane connector, and including a respective individual card slot of said plurality of card slots, said dummy panel face plate element comprising:

a face plate sized to fit adjacent to upper and lower confines of said card insertion opening;

an upper lip adjacent to an upper edge, and a lower lip adjacent to a lower edge of said face plate, said upper lip having a first notch sized to receive and capture therein a first portion of said cabinet adjacent to an upper edge of said card insertion opening, and said lower lip having a second notch sized to receive and capture a second portion of said cabinet adjacent to a lower edge portion of said card insertion opening; and a simulated circuit card structure having card simulating wall portions extending from and solid with said face plate and being sized to fit within and slidably engage upper and lower card insertion tracks of said individual card slot; and wherein one of said upper and lower lips is inwardly flexible relative to the other of said upper and lower lips, providing for insertion of said card-simulating wall portions of said dummy panel face plate element into and along only a first portion of a depth of said upper and lower card insertion tracks, said first and second notches receiving and capturing therein said first and second portions of said cabinet, when said one of said upper and lower lips is flexed away from the other of said upper and lower lips.

2. A dummy panel face plate element according to claim 1, wherein said simulated circuit card structure is sized smaller than a respective one of said electronic circuit cards, with said card-simulating wall portions thereof extending from and solid with said face plate and being sized to fit within and slidably engage only a first portion of a depth of upper and lower card insertion tracks of said respective individual card slot, thereby leaving a second portion of said depth of said upper and lower card insertion tracks empty.

3. A dummy panel face plate element according to claim 1, wherein said upper lip is located beneath said upper edge, and has said first notch located immediately adjacent to a rear surface of said face plate that is sized to fit within and be captured by said first portion of said cabinet immediately adjacent to an upper edge of said card insertion opening, and wherein said lower lip is configured as a generally U-shaped, flexible lower lip and has a first lip wall portion that is solid with and projects away from said lower edge of said face plate, and a second, flexible lip wall portion extending forwardly and downwardly inclined at an acute angle from a U-bend in said first lip wall portion forming a first finger grip element, and having said second notch that is sized to receive and capture said second portion of said cabinet immediately adjacent to a lower edge of said card insertion opening.

4. A dummy panel face plate element according to claim 3, wherein said first lip wall portion of said lower lip extends forwardly of a front surface of said face plate forming a second finger grip element.

5. A dummy panel face plate element according to claim 1, wherein one of said upper and lower lips is generally U-shaped, having a first lip wall portion solid with and extending away from a rear surface of said face plate, and a second, flexible lip wall portion, containing one of said first and second notches, that is sized to receive and capture therein said one of said first and second portions of said cabinet and extending from said first lip wall portion.

6. A dummy panel face plate element according to claim 5, further including a first finger grip element extending from a front surface of said face plate, and wherein said lower lip extends beyond said lower edge of said face plate and includes a second finger grip element that is generally alongside said first finger grip element.

7. A dummy panel face plate element according to claim 5, wherein said flexible lip wall portion has a bend that allows said lower lip to clear a lower edge of said individual card slot.

8. A dummy panel face plate element according to claim 5, wherein said flexible lip wall portion has a flange that prevents said dummy panel face plate element from being removed from said individual card slot unless said flexible lip wall portion is flexed sufficiently upwardly to pass by a lower edge of said individual card slot.

9. A dummy panel face plate element for closing a card insertion opening of an electronic equipment cabinet, said card insertion opening being sized to expose a plurality of electronic circuit card slots, an individual card slot of said plurality of electronic card slots containing card insertion tracks into which a respective electronic circuit card is slidably insertable to engage a backplane connector, said dummy panel face plate element comprising:

a generally flat face plate configured to fit between upper and lower confines of said card insertion opening;

a top lip adjacent to a top edge of said generally flat face plate and having a first notch sized to receive and capture therein a first portion of said cabinet adjacent to an upper edge of said card insertion opening, and a bottom lip adjacent to a bottom edge of said generally flat face plate, said bottom lip having a second notch sized to receive and capture therein a second portion of said cabinet adjacent to a lower edge portion of said card insertion opening; and a simulated circuit card structure having card-simulating wall portions extending from and solid with said face plate and being sized to fit within and slidably engage upper and lower card insertion tracks of said individual card slot; and wherein one of said top and bottom lips is flexible relative toward the other of said top and bottom lips, as said card-simulating wall portions of said simulated circuit card structure of said dummy panel face plate element are inserted into and travel along said upper and lower card insertion tracks, so that said first and second notches receive and capture therein said first and second portions of said cabinet when said one of said top and bottom lips is flexed away from the other of said top and bottom lips.

10. A dummy panel face plate element according to claim 9, wherein said simulated circuit card structure is sized smaller than said respective electronic circuit card, with said card-simulating wall portions thereof extending from and solid with said face plate and being sized to fit within and slidably engage only a first portion of a depth of said upper and lower card insertion tracks of said individual card slot, thereby leaving a second portion of said depth of said upper and lower card insertion tracks empty.

11. A dummy panel face plate element according to claim 10, wherein one of said top lip and said bottom lip is generally U-shaped, having a first lip wall portion solid with and extending away from said face plate , and a second, flexible lip wall portion, containing one of said first and second notches, extending from said first lip wall portion.

12. A dummy panel face plate element according to claim 11, wherein said flexible lip wall portion is downwardly inclined at an acute angle and has a bend that allows said bottom lip to clear a lower edge of said individual card slot.

13. A dummy panel face plate element according to claim 12, wherein said flexible lip wall portion has a flange that prevents said dummy panel face plate element from being removed from said individual card slot unless said flexible lip wall portion is flexed sufficiently upwardly to pass by said lower edge of said individual card slot.

14. A blank face plate for engaging an electronic equipment rack directly behind a front panel card insertion opening providing access to multiple card slots, into an individual card slot of which an electronic circuit card is insertable, said blank face plate comprising a generally flat face plate element, a rearwardly projecting upper lip located adjacent to a top edge of said face plate, and having a first notch configured to receive and be captured by a first portion of said equipment rack, a rearwardly projecting, generally U-shaped, flexible lower lip adjacent to a lower edge of said face plate, said flexible lower lip having a second notch configured to receive and be captured by a second portion of said equipment rack, and a simulated circuit card structure having card-simulating wall portions extending from and solid with said generally flat face plate element and being sized to fit within and slidably engage upper and lower card insertion tracks of said individual card slot.

15. A blank face plate according to claim 14, wherein said simulated circuit card structure is sized smaller than said electronic circuit card, with said card-simulating wall portions thereof extending from and solid with said face plate and being sized to fit within and slidably engage only a first portion of a depth of said upper and lower card insertion tracks of said individual card slot, thereby leaving a second portion of said depth of said upper and lower card insertion tracks empty.

16. A blank face plate according to claim 14, wherein said flexible lower lip has a bend that allows said flexible lower lip to clear a front edge of said individual card slot.

17. A blank face plate according to claim 16, wherein said flexible lower lip has a downwardly inclined second lip wall portion containing a flange that prevents said face plate from being removed from said individual card slot unless said flexible lower lip is flexed upwardly.

18. A method of closing a card insertion opening of an electronic equipment cabinet, said card insertion opening being sized to expose a plurality of electronic circuit card slots, an individual card slot thereof having upper and lower card insertion tracks into which a respective electronic circuit card is slidably insertable to engage an associated backplane connector therefor, said method comprising the steps of:

(a) providing a dummy panel face plate that is sized to fit adjacent to upper and lower confines of said card insertion opening, an upper lip adjacent to an upper edge, and a lower lip adjacent to a lower edge of said face plate, said upper lip having a first notch sized to receive and capture therein a first portion of said cabinet adjacent to an upper edge of said card insertion opening, and said lower lip having a second notch sized to receive and capture therein a second portion of said cabinet adjacent to a lower edge portion of said card insertion opening, and a simulated circuit card structure having card-simulating wall portions extending from and solid with said dummy panel face plate and being sized to fit within and slidably engage said upper and lower card insertion tracks of said individual card slot, one of said upper and lower lips being inwardly flexible relative to the other of said upper and lower lips;

(b) inserting said dummy panel face plate into said individual card slot, while flexing said one of said upper and lower lips toward the other of said upper and lower lips, so that said card-simulating wall portions of said simulated circuit card structure of said dummy panel face plate travel along said upper and lower card insertion tracks; and (c) releasing said one of said upper and lower lips, with said first and second notches being aligned with said first and second portions of said cabinet, so as to allow said one of said upper and lower lips to flex away from the other of said upper and lower lips, and cause said first and second notches to receive and capture therein said first and second portions of said cabinet.

19. A method according to claim 18, wherein said simulated circuit card structure is sized smaller than said respective electronic circuit card, with said card-simulating wall portions thereof extending from and solid with said face plate and being sized to fit within and slidably engage only a first portion of a depth of upper and lower card insertion tracks of said individual card slot, thereby leaving a second portion of said depth of said upper and lower card insertion tracks empty, when said one of said upper and lower lips is released in step (c).

20. A method according to claim 18, wherein one of said upper and lower lips of said dummy panel face plate provided in step (a) is generally U-shaped, having a first lip wall portion solid with and extending away from a rear surface of said face plate, and a second, flexible lip wall portion, containing one of said first and second notches, which receives and captures therein one of said first and second portions of said cabinet, and extends from said first lip wall portion.

21. A method according to claim 20, wherein said upper lip of said face plate provided in step (a) is located beneath said upper edge, and has said first notch located immediately adjacent to said rear surface of said dummy panel face plate that receives and captures therein said first portion of said cabinet in an upper region of an equipment cabinet frame immediately adjacent to said card insertion opening, and wherein said lower lip is generally U-shaped, and has said first lip wall portion solid with and projecting away from said lower edge of said face plate, and said second, flexible lip wall portion extends forwardly and is downwardly inclined at an acute angle from a U-bend with said first lip wall portion forming a first finger grip element, and wherein said first lip wall portion of said lower lip of said dummy panel face plate provided in step (a) extends forwardly of a front surface of said face plate forming a second finger grip element.

22. A method according to claim 21, wherein said second, flexible lip wall portion has a bend that allows said lower lip to clear a front edge of a lower portion of said individual card slot, and wherein said second, flexible lip wall portion has a flange that prevents said dummy panel face plate from being removed from said individual card slot unless said second, flexible lip wall portion is flexed sufficiently upwardly to pass by panel front edge of said individual card slot.

* * * * *